(12) United States Patent
Taniguchi et al.

(10) Patent No.: US 9,276,374 B2
(45) Date of Patent: Mar. 1, 2016

(54) LASER APPARATUS

(71) Applicant: Furukawa Electric Co., Ltd., Tokyo (JP)

(72) Inventors: Hidehiro Taniguchi, Tokyo (JP); Yutaka Ohki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 14/078,547

(22) Filed: Nov. 13, 2013

(65) Prior Publication Data

US 2014/0072007 A1 Mar. 13, 2014

Related U.S. Application Data

(63) Continuation of application No. PCT/JP2012/003211, filed on May 16, 2012.

(30) Foreign Application Priority Data

Jun. 2, 2011 (JP) .................................. 2011-124621
Feb. 20, 2012 (JP) .................................. 2012-033826

(51) Int. Cl.
*H01S 5/14* (2006.01)
*H01S 5/00* (2006.01)
(Continued)

(52) U.S. Cl.
CPC .............. *H01S 5/005* (2013.01); *G02B 6/4202* (2013.01); *G02B 6/4248* (2013.01); *H01S 5/022* (2013.01);
(Continued)

(58) Field of Classification Search
CPC ...... H01S 5/146; H01S 5/147; H01S 5/02252
USPC .......................................... 372/36, 102, 43.01
See application file for complete search history.

(56) References Cited

U.S. PATENT DOCUMENTS

| | | | |
|---|---|---|---|
| 5,870,417 A * | 2/1999 | Verdiell et al. | 372/32 |
| 2001/0048702 A1* | 12/2001 | Yoshida et al. | 372/43 |

(Continued)

FOREIGN PATENT DOCUMENTS

| | | | |
|---|---|---|---|
| JP | 2001-235638 A | 8/2001 | |
| JP | 2001-251014 A | 9/2001 | |

(Continued)

OTHER PUBLICATIONS

Campbell et al. "Wavelength stable uncooled fibre grating semiconductor laser for use in an all optical WDM access network," Jan. 1996, Electronic Letters, vol. 32 No. 2, pp. 119-120.*

(Continued)

*Primary Examiner* — Yuanda Zhang
*Assistant Examiner* — Michael Carter

(57) ABSTRACT

To achieve stable multimode output even when driven by a drive current near a threshold value, provided is a laser apparatus comprising a semiconductor laser element; a wavelength selecting element that performs laser oscillation by forming a resonator between itself and a reflective surface of the semiconductor laser element to output oscillated laser light; and an optical system that is optically coupled to an emission surface of the semiconductor laser element with a coupling efficiency $\eta$ and inputs to the wavelength selecting element light output from the emission surface. The optical system causes a value that is correlated with a minimum light output within a linear light output region in which light output is linear with respect to an injection current injected to the semiconductor laser element to be less than this value occurring when the coupling efficiency $\eta$ is at a maximum.

16 Claims, 13 Drawing Sheets

(51) Int. Cl.
 *H01S 5/022* (2006.01)
 *G02B 6/42* (2006.01)
 *H01S 5/024* (2006.01)

(52) U.S. Cl.
 CPC ............. *H01S 5/02252* (2013.01); *H01S 5/146* (2013.01); *H01S 5/147* (2013.01); *H01S 5/02284* (2013.01); *H01S 5/02415* (2013.01); *H01S 5/02484* (2013.01); *H01S 5/02492* (2013.01); *H01S 2301/16* (2013.01)

(56) References Cited

U.S. PATENT DOCUMENTS

| | | | |
|---|---|---|---|
| 2002/0048067 A1* | 4/2002 | Handelman et al. | 359/139 |
| 2004/0196884 A1 | 10/2004 | Ohkubo et al. | |
| 2004/0208441 A1* | 10/2004 | Cheng et al. | 385/33 |

FOREIGN PATENT DOCUMENTS

| | | |
|---|---|---|
| JP | 2002-250844 A | 9/2002 |
| JP | 2003-60317 A | 2/2003 |
| JP | 2004-55623 A | 2/2004 |
| JP | 2005-136158 A | 5/2005 |
| WO | 2008/050537 A1 | 5/2008 |

OTHER PUBLICATIONS

International Preliminary Report on Patentability and Written Opinion for International Application No. PCT/JP2012/003211, issued by the International Bureau of WIPO on Dec. 12, 2013.

International Search Report for International Application No. PCT/JP2012/003211, issued by the Japanese Patent Office on Jun. 26, 2012.

Notification of Reasons for Refusal of Japanese Patent Application No. 2011-124621, issued by the Japanese Patent Office on Jul. 26, 2011.

Notification of Reasons for Refusal of Japanese Patent Application No. 2012-0033826, issued by the Japanese Patent Office on Nov. 20, 2012.

Notification of Office Action for Chinese Patent Application No. 201280019906.7, issued by the State Intellectual Property Office of the People's Republic of China on May 20, 2015.

\* cited by examiner

LASER APPARATUS

BACKGROUND

1. Technical Field

The present invention relates to a laser apparatus.

2. Related Art

With a conventional semiconductor laser module, a lensed fiber formed by performing lens processing on the top of an optical fiber is used to focus light output from a semiconductor laser element, and this light is propagated to the outside of the semiconductor laser module through the optical fiber, as shown in Patent Document 1, for example.

Patent Document 1: Japanese Patent Application Publication No. 2001-235638

However, when such a semiconductor laser module is driven by a relatively low drive current near a threshold value, single mode oscillation begins. When the drive current is increased, the oscillation results in unstable output light that mixes single mode and multimode oscillation. When the drive current is further increased, multimode oscillation is realized and the output light stabilizes. Accordingly, the semiconductor laser module requires use of a drive current that is in a range greater than or equal to a predetermined current value that enables stable multimode oscillation.

SUMMARY

Therefore, it is an object of an aspect of the innovations herein to provide a laser apparatus, which is capable of overcoming the above drawbacks accompanying the related art. The above and other objects can be achieved by combinations described in the claims. According to a first aspect of the present invention, provided is a laser apparatus comprising a semiconductor laser element; a wavelength selecting element that performs laser oscillation by forming a resonator between itself and a reflective surface of the semiconductor laser element to output oscillated laser light; and an optical system that is optically coupled to an emission surface of the semiconductor laser element with a coupling efficiency $\eta$ and inputs to the wavelength selecting element light output from the emission surface. The optical system causes a value that is correlated with a minimum light output within a linear light output region in which light output is linear with respect to an injection current injected to the semiconductor laser element to be less than this value occurring when the coupling efficiency $\eta$ is at a maximum.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
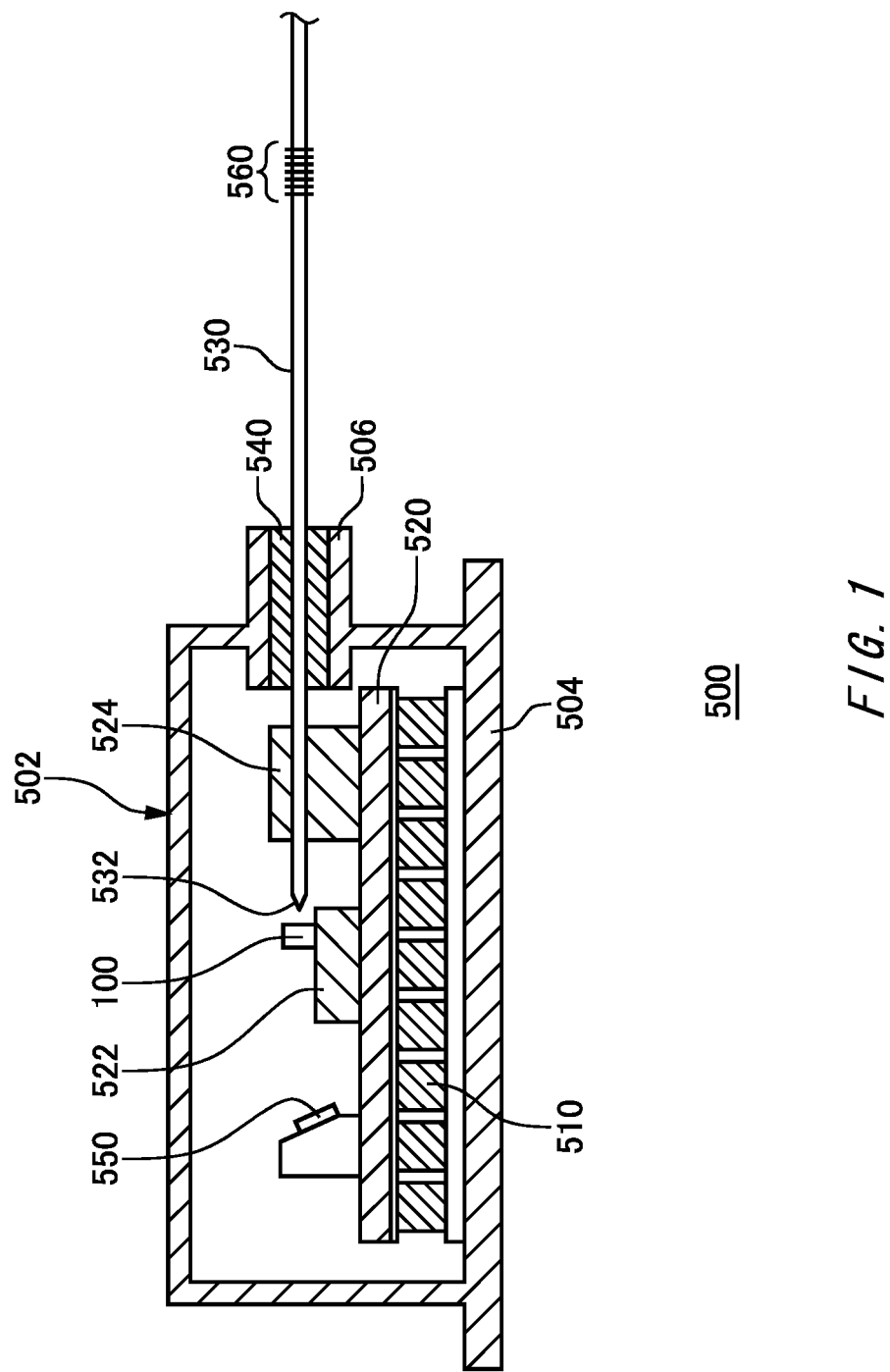
FIG. 1 shows an exemplary configuration of a laser apparatus according to a first embodiment of the present invention.

FIG. 1 shows an exemplary configuration of a laser apparatus 500 according to a first embodiment of the present invention. FIG. 1 is an exemplary side view of a chassis 502 of the laser apparatus 500. The laser apparatus 500 has a semiconductor laser element 100 mounted thereon and is used within a linear light output range in which the light output is linear, to stabilize the light output in this light output range while causing a minimum driving light output to draw nearer to an oscillation threshold current of the semiconductor laser element 100.

The laser apparatus 500 includes the semiconductor laser element 100, the chassis 502, a bottom board 504, a cylindrical hole portion 506, a temperature adjusting portion 510, a base 520, a mount 522, a fiber fixing portion 524, an optical fiber 530, a sleeve 540, a light receiving section 550, and a wavelength selecting element 560.

The semiconductor laser element 100 is a ridge-type semiconductor laser element having a ridge structure, for example. The semiconductor laser element 100 outputs laser light in a 980 nm band or a 1480 nm band.

The chassis 502, the bottom board 504, and the cylindrical hole portion 506 are formed of metal. The chassis 502, the bottom board 504, and the cylindrical hole portion 506 may be formed of copper tungsten (CuW) and form a sealed interior, for example. The chassis 502, the bottom board 504, and the cylindrical hole portion 506 may form a butterfly package.

The temperature adjusting portion 510 is mounted on the bottom board 504 and maintains a constant temperature on the top surface thereof, i.e. the surface of the temperature adjusting portion 510 facing away from the bottom board 504. The temperature adjusting portion 510 may be an electronic cooling apparatus that uses a Peltier element or the like. The base 520 is mounted on the top surface of the temperature adjusting portion 510 and transmits the constant temperature maintained by the temperature adjusting portion 510 to the top surface of the base 520, i.e. the surface of the base 520 facing away from the temperature adjusting portion 510. The base 520 may be formed of material including aluminum nitride (AlN), copper tungsten (CuW), Si, or diamond.

The mount 522 is mounted on the top surface of the base 520 and fixes the semiconductor laser element 100. The mount 522 transmits to the semiconductor laser element 100 the constant temperature maintained by the temperature adjusting portion 510, thereby keeping the semiconductor laser element at a constant temperature. The mount 522 may be formed of the same material as the base 520.

The fiber fixing portion 524 is mounted on the top surface of the base 520, and fixes the optical fiber 530. The fiber fixing portion 524 may fix the optical fiber 530 using solders, resin, glass with a low melting point, adhesive, or the like.

The optical fiber 530 is inserted into the chassis 502 through the cylindrical hole portion 506, from outside the chassis 502. An optical system is formed at the tip of the optical fiber 530 to optically couple with the emission surface of the semiconductor laser element 100 with a predetermined coupling efficiency η, and this optical system inputs the light output from the emission surface into the wavelength selecting element 560. One end of the optical system is formed as a lens to serve as a lensed fiber 532 that guides the laser light emitted from the semiconductor laser element 100 to the wavelength selecting element 560.

Instead, the optical system may be a ball lens or cylindrical lens formed of quartz glass. Such an optical system is fixed near the light output end of the semiconductor laser element 100 and focuses the light output of the semiconductor laser element 100. In this way, the optical fiber 530 can transmit the light output of the semiconductor laser element 100 to the outside of the chassis 502.

The sleeve 540 is provided between the chassis 502 and the optical fiber 530, and fixes the optical fiber 530 to the chassis 502. The sleeve 540 may fix the optical fiber 530 using solders, resin, glass with a low melting point, adhesive, or the like.

The light receiving section 550 receives the light output from the semiconductor laser element 100, and monitors the light output of the semiconductor laser element 100. The light receiving section 550 may be provided on the high reflection coating side of the semiconductor laser element 100. The light receiving section 550 may be a photodiode.

The wavelength selecting element 560 forms an oscillator between itself and the reflective surface of the semiconductor laser element 100 to achieve laser oscillation, and outputs the oscillated laser light. The wavelength selecting element 560 is a wavelength-selective filter that passes a portion of the light output from the semiconductor laser element 100 and reflects the remaining light output. The wavelength selecting element 560 may be a fiber Bragg grating that functions as a wavelength-selective reflective filter by using periodic refractive index modulation within the core of the optical fiber 530, for example.

Figure 2:
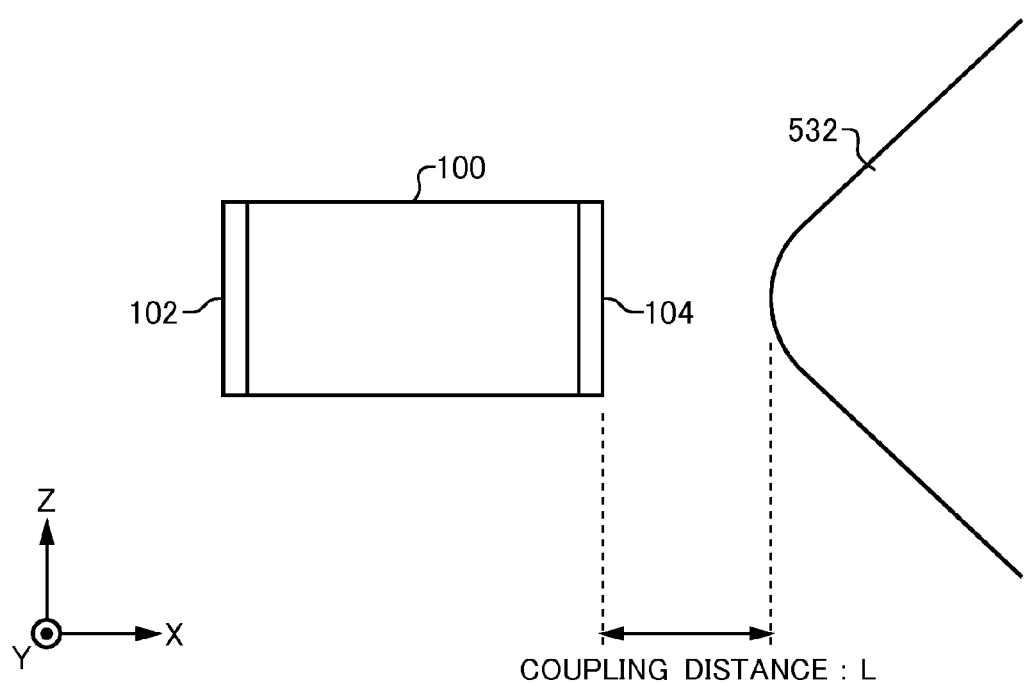
FIG. 2 is a side view of a lensed fiber and the semiconductor laser element according to the first embodiment.
Figure 3:
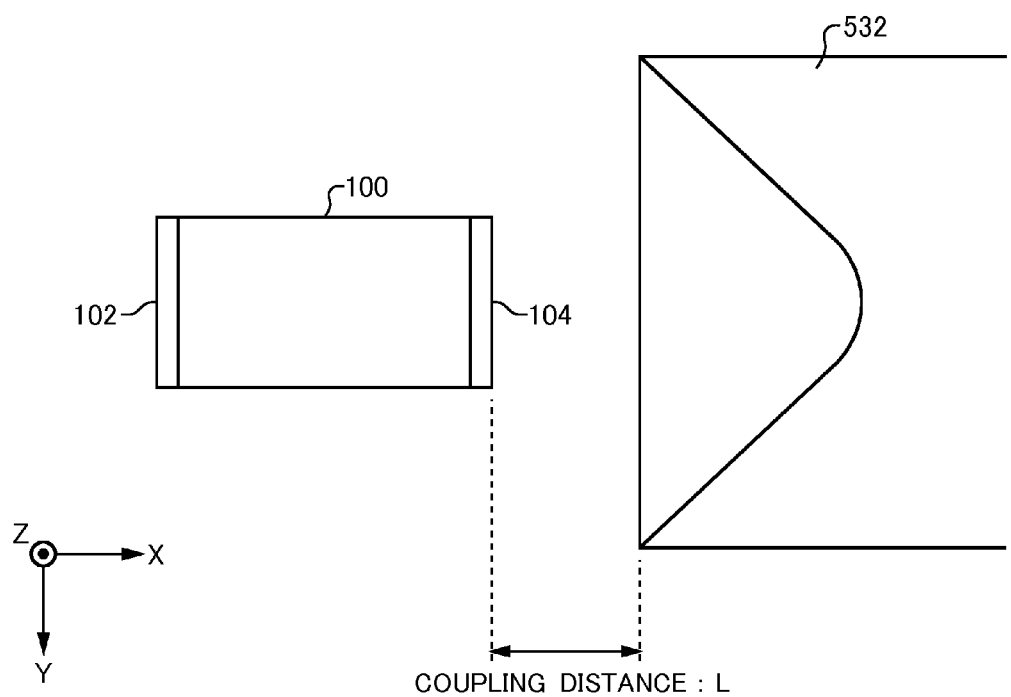
FIG. 3 is a top view of the lensed fiber and the semiconductor laser element according to the first embodiment.

FIG. 2 is a side view of a lensed fiber 532 and the semiconductor laser element 100 according to the first embodiment. FIG. 3 is a top view of the lensed fiber 532 and the semiconductor laser element 100 according to the first embodiment. The semiconductor laser element 100 includes a high reflection coating 102 and a low reflection coating 104.

The high reflection coating 102 is formed on the end surface of the semiconductor laser element 100 opposite the lensed fiber 532, and reflects laser light. The high reflection coating 102 forms an optical resonator together with the wavelength selecting element 560 provided outside the semiconductor laser element 100, and the laser light is amplified within this optical resonator. The high reflection coating 102 is formed by layering a plurality of dielectric films on the end surface created by cleaving a wafer.

The low reflection coating 104 is formed on the end surface on the lensed fiber 532 side of the semiconductor laser element 100, has a reflectance with respect to laser light that is lower than that of the high reflection coating 102, and emits a portion of the laser light resonated in the optical resonator to the outside as emitted light. The low reflection coating 104 is formed by layering a plurality of dielectric films on an end surface formed by cleaving a wafer. The light output end surface of the semiconductor laser element 100 has the low reflection coating 104 formed thereon, and emits light.

The lensed fiber 532 is a fiber in which a tip portion is processed to be a convex lens in the Z direction and no processing is performed in the Y direction or X direction. The semiconductor laser element 100 and the lensed fiber 532 are fixed at positions separated by the coupling distance L.

Figure 4:
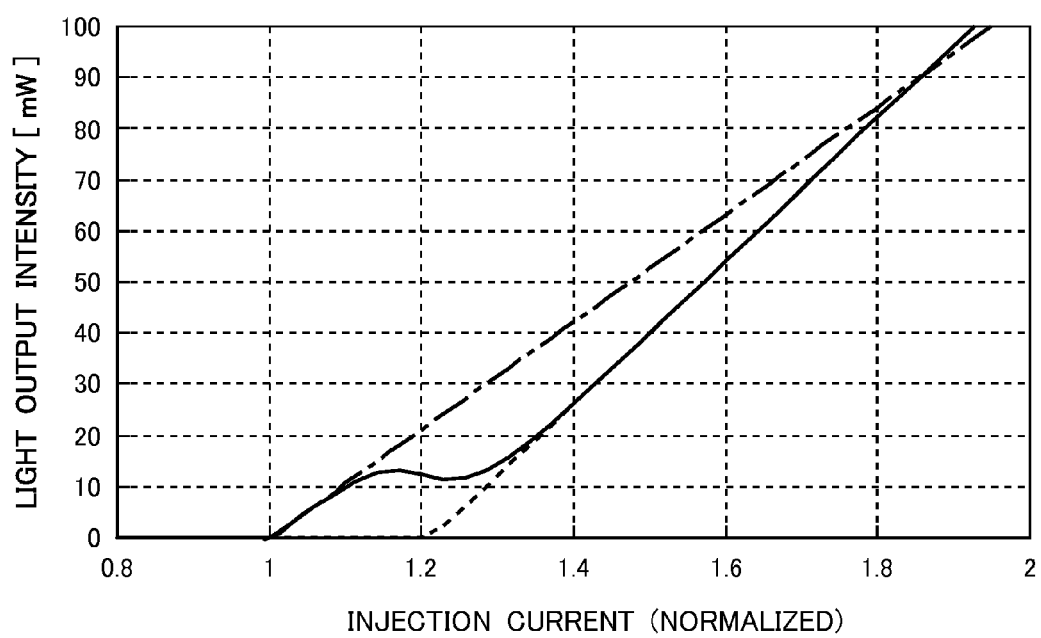
FIG. 4 shows a relationship between the light output intensity and the injection current of a conventional laser apparatus.

FIG. 4 shows a relationship between the light output intensity and the injection current of a conventional laser apparatus. Here, a conventional laser apparatus is created by positioning the lensed fiber 532 and the semiconductor laser element 100 of the laser apparatus 500 according to the first embodiment such that the coupling distance L between the semiconductor laser element 100 and the lensed fiber 532 is a value resulting in maximum coupling efficiency between the semiconductor laser element 100 and the lensed fiber 532. The horizontal axis in FIG. 4 shows the current injected into a semiconductor laser element that conforms to the standards of the oscillation threshold current of the semiconductor laser element. Furthermore, the vertical axis in FIG. 4 shows the light output intensity for the current injected into the laser apparatus.

The semi-dashed line in the graph of FIG. 4 represents the relationship between the light output intensity and the injected current when the laser apparatus performs single mode oscillation. The dashed line in the graph of FIG. 4 represents the relationship between the light output intensity and the injected current when the laser apparatus performs multimode oscillation.

The laser apparatus performs laser oscillation by being driven with an injection current greater than or equal to the threshold current. The laser apparatus performs single mode oscillation when driven with an injection current in a relatively low range near the threshold current. When the injected current is increased, the laser apparatus performs oscillation with an unstable light output that mixes single mode and multimode. When the drive current is increased further, multimode oscillation is realized and the light output becomes stable.

Specifically, the light output is unstable when the laser apparatus performs single mode oscillation when the injection current is within a relatively low range near the threshold current and when the laser apparatus mixes single mode oscillation and multimode oscillation. Therefore, conventionally, the minimum output light for driving the laser apparatus is set to be greater than or equal to the light output at which the multimode oscillation begins, e.g. 40 mW or more, and the laser apparatus is driven with the drive current that is greater than or equal to the injection current corresponding to the set output light. In this way, the laser apparatus uses light output in a range of the linear light output region, e.g. a light output of 40 mW or more.

The laser apparatus 500 according to the first embodiment causes the range in which single mode oscillation is performed and the range in which the single mode oscillation and the multimode oscillation are mixed to be in a lower light output intensity range, thereby lowering the minimum light output for driving the laser apparatus 500. The laser apparatus 500 according to the first embodiment has the following conditions for reducing the minimum driving light output of the laser apparatus 500, based on a model of the light output characteristics of the laser apparatus 500.

Figure 5:
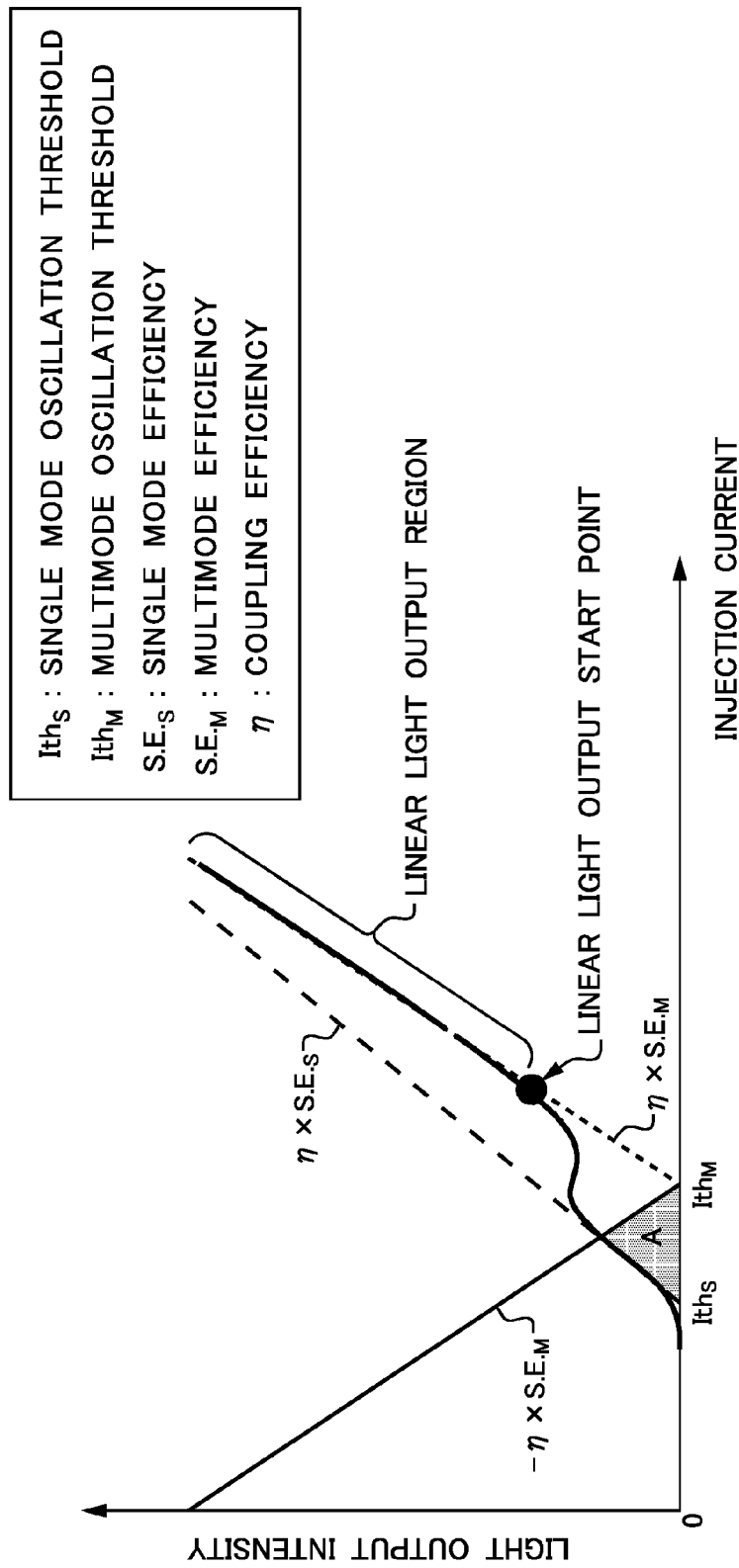
FIG. 5 shows a model of the relationship between the light output intensity and the injection current in the laser apparatus according to the first embodiment.

FIG. 5 shows a model of the relationship between the light output intensity and the injection current in the laser apparatus 500 according to the first embodiment. The horizontal axis of FIG. 5 shows the current injected into the semiconductor laser element 100. The vertical axis in FIG. 5 shows the light output intensity relative to the injection current of the laser apparatus 500.

The dotted line shown by $\eta \times S.E._S$ in FIG. 5 shows the relationship between the light output intensity and the injection current for having the laser apparatus 500 perform single mode oscillation from the threshold current $I_{thS}$. The dotted line shown by $\eta \times S.E._M$ in FIG. 5 shows the relationship between the light output intensity and the injection current when the laser apparatus 500 performs multimode oscillation from the threshold current $I_{thM}$.

Here, $\eta$ is the coupling efficiency between the semiconductor laser element 100 and the optical system that inputs to the wavelength selecting element 560 the light output from the semiconductor laser element 100. Furthermore, $I_{thS}$ is the single mode oscillation threshold value at which the laser apparatus 500 performs single mode oscillation, and $S.E._S$ is the oscillation efficiency for the single mode oscillation. Furthermore, $I_{thM}$ is the multimode oscillation threshold value at which the laser apparatus 500 performs multimode oscillation, and $S.E._M$ is the oscillation efficiency for the multimode oscillation.

In response to the increase of the injection current, the laser apparatus 500 performs single mode oscillation from a value near $I_{thS}$ to output laser light, and then transitions to a linear light output region for multimode oscillation from a linear light output start point after passing through a range in which the single mode oscillation and multimode oscillation are mixed. In other words, the laser apparatus 500 performs longitudinal multimode oscillation within a light output range that is greater than or equal to the minimum light output for driving, i.e. the linear light output start point.

Here, when the line shown by $-\eta \times S.E._M$ passing through $I_{thM}$ is drawn in FIG. 5, the lines of the injection current axis, $\eta \times S.E._S$, and $-\eta \times S.E._M$ form a triangle with an area A. The area A of this triangle can be calculated as shown below in Expression 1.

$$A = \{I_{thS}^2 \cdot S.E._M \cdot \eta \cdot (M+1)^{-1} \cdot (N-1)^2\}/2 \quad \text{Expression 1}$$

Here, $M = S.E._M/S.E._S$ and $N = I_{thM}/I_{thS}$. The value of A calculated from Expression 1 is correlated with the linear light output start point, which is the minimum light output in the linear light output region for the injection current injected to the semiconductor laser element 100.

Figure 6:
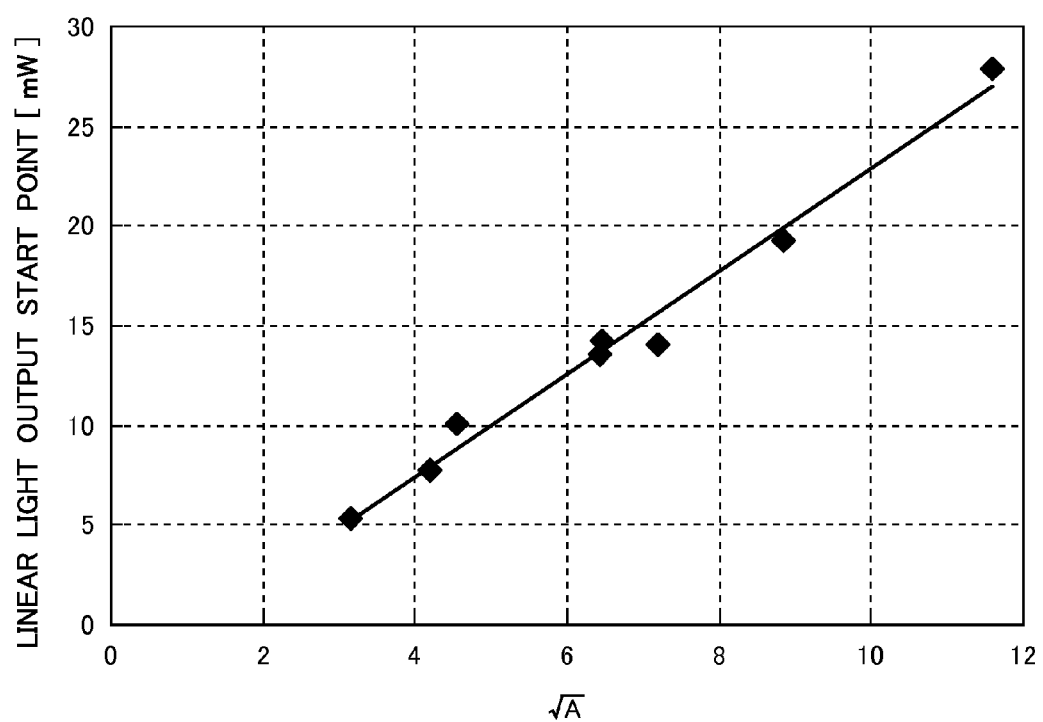
FIG. 6 shows an exemplary relationship between the linear light output start point and the value A of the laser apparatus according to the first embodiment.

FIG. 6 shows an exemplary relationship between the linear light output start point and the value A of the laser apparatus 500 according to the first embodiment. The horizontal axis in FIG. 6 shows the square root of the value A of the laser apparatus 500. The vertical axis in FIG. 6 shows the linear light output start point of the laser apparatus 500.

FIG. 6 shows plotted results obtained by actually manufacturing a plurality of laser apparatuses 500 and then measuring the light output characteristics of each laser apparatus 500 with respect to the injection current to determine the value A from Expression 1 and the linear light output start point. The relationship between the square root of A from Expression 1 and the linear light output start point is understood to be proportional, based on FIG. 6. In other words, by decreasing the value A of Expression 1, the linear light output start point of the laser apparatus 500 can be decreased. In addition, by using this correlation and decreasing the value A without limitation, the linear light output start point can be brought near zero. In this case, the square root of the value A approaches 1.

Therefore, the laser apparatus 500 according to the first embodiment sets the value A of Expression 1, which is correlated with the linear light output start point, to be less than the value allowed for the minimum light output for driving. In other words, according to Expression 1, the parameters $\eta$, $I_{thS}$, $I_{thM}$, $S.E._S$, and $S.E._M$ are determined such that the value A is less than the value allowed for the minimum light output for driving.

For example, when the minimum driving light output of the laser apparatus 500 is desired to be 10 mW, according to the graph of FIG. 6, the value allowable for A can be determined to be approximately 16. Here, the unit for the value A is mW·mA. Accordingly, Expression 1 can be used to obtain each parameter such that A is no greater than 16, and by forming the laser apparatus 500 based on these parameters, the minimum driving light output of the resulting laser apparatus 500 can be set to 10 mW.

By adjusting the optical system, the value of each parameter in the laser apparatus 500 can be adjusted. Furthermore, the value of each parameter in the laser apparatus 500 can also be adjusted by adjusting the design values during manufacturing of the semiconductor laser element 100. For example, the $\eta$ value of the laser apparatus 500 can be directly changed by adjusting the arrangement of the optical system.

The $I_{thS}$ value is believed to depend on the effective mirror loss, the internal loss, the internal quantum efficiency, the confinement coefficient, the gain, the number of quantum wells, the stripe width, and the like. Other than the effective mirror loss, all of these characteristics are design parameters of the semiconductor laser element 100, and are practically unaffected by adjustment of the optical system. The effective mirror loss is believed to depend on the coupling efficiency $\eta$, the reflectance of the wavelength selecting element 560, the element end surface reflectance, and the element length of the semiconductor laser element 100. In other words, aside from the coupling efficiency $\eta$, these characteristics are design parameters of the laser apparatus 500 or the semiconductor laser element 100 and are barely affected by adjustment of the optical system.

In this way, it is predicted that the $I_{thS}$ value will barely change as a result of adjusting the optical system. In practice, experimental results were obtained in which, even when the coupling efficiency $\eta$ is changed from 80% to 65% by adjusting the optical system, the $I_{thS}$ value of the laser apparatus 500 changed by only about 3.5%.

The $S.E._M$ value is believed to depend on the effective mirror loss, the internal loss, and the internal quantum efficiency, and it is expected that these parameters would barely change as a result of the optical system being adjusted. In practice, experimental results were obtained in which, even when the coupling efficiency $\eta$ is changed from 80% to 65% by adjusting the optical system, the $I_{thS}$ value of the laser apparatus 500 changed by only about 1%.

Based on the above, it is understood that the $I_{thS}$ value and $S.E._M$ value of the laser apparatus 500 can be adjusted in a manner that is almost completely unrelated to adjustment of the optical system, according to the design of the semiconductor laser element 100. Furthermore, the $I_{thS}$ and $S.E._M$ terms are in the first half of Expression 1 for calculating A, and therefore an expression removing this portion and the constants can be defined as B, as shown in Expression 2 below.

$$B = \eta \cdot (M+1)^{-1} \cdot (N-1)^2$$ Expression 2

In other words, the value B can be calculated as the portion within the value of A that changes according to optical adjustment. Therefore, the manner in which B, M, N, and η change in response to optical adjustment in the laser apparatus 500 is clearly understood to be as shown below, as a result of experimentation.

Figure 7:
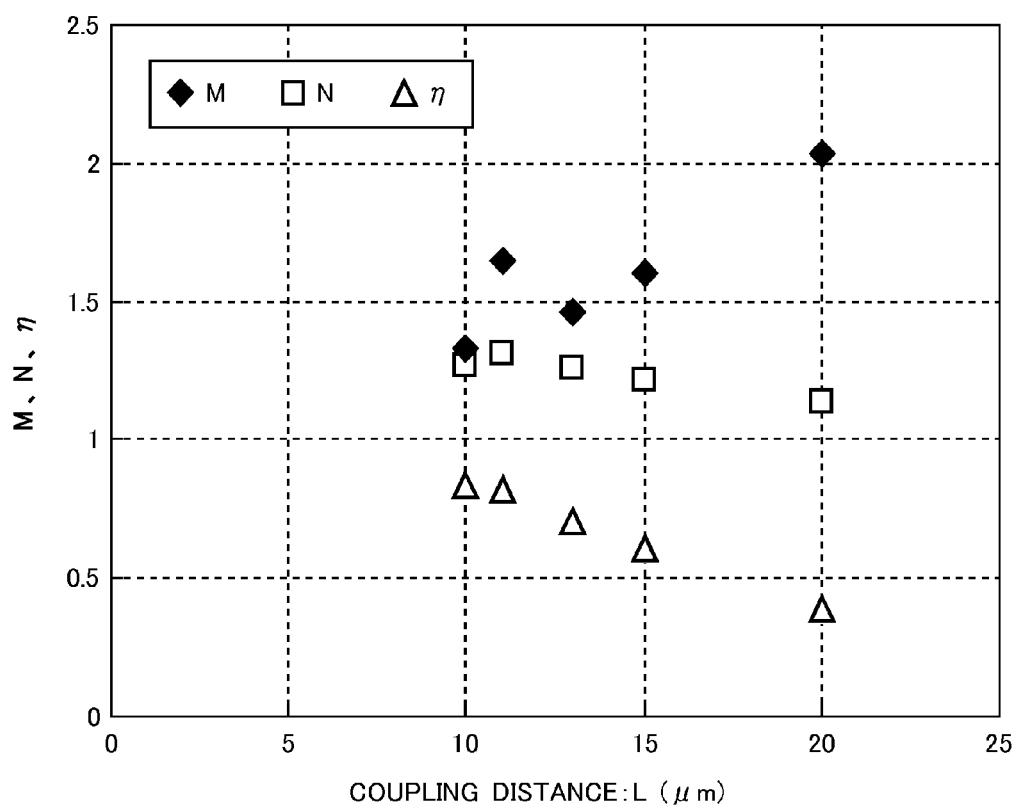
FIG. 7 shows an exemplary relationship between the coupling distance L and the parameters M, N, and $\eta$ in the laser apparatus according to the first embodiment.

FIG. 7 shows an exemplary relationship between the coupling distance L and the parameters M, N, and η in the laser apparatus 500 according to the first embodiment. The coupling distance L is the distance between the semiconductor laser element 100 and the lensed fiber 532. In this example, the coupling distance L is increased from approximately 10 μm, which is accompanied by a decrease in the η value, and it is understood that the highest coupling efficiency is realized when the coupling distance L is approximately 10 μm, within the range of experimental results. On the other hand, it is understood that M and N change in a complex manner relative to the increase in the coupling distance L.

Figure 8:
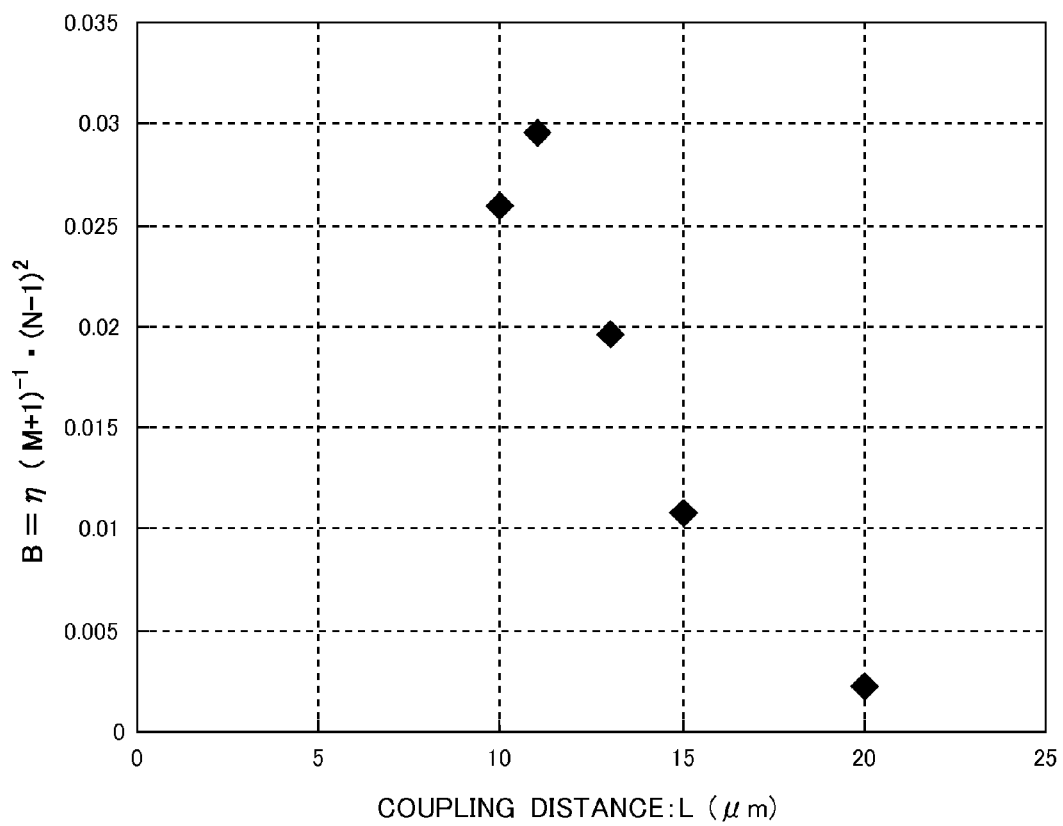
FIG. 8 shows an exemplary relationship between the value B and the coupling distance L of the laser apparatus according to the first embodiment.

FIG. 8 shows an exemplary relationship between the value B and the coupling distance L of the laser apparatus 500 according to the first embodiment. It is understood that the value B reflects changes in M and N, and changes in a complex manner relative to the increase in the coupling distance L. For example, the value B exhibits a peak when the coupling distance L is approximately 11 μm, and it is understood that the trend of change of the value B is different from the trend of change of the coupling efficiency. Here, A is a value obtained by multiplying the value B by a parameter that barely changes in response to optical adjustment, and therefore the trend of change of the value A also differs from the trend of change of the coupling efficiency, in the same manner as B.

In other words, it is understood that there are cases where the A and B values of the laser apparatus 500 increase even when the coupling efficiency η is decreased. Therefore, the optical system of the laser apparatus 500 is adjusted such that the value A is less than the value A when the coupling efficiency η is at a maximum. In the present embodiment, by positioning the lensed fiber 532 relative to the laser light emission end of the semiconductor laser element 100 such that the coupling efficiency η is maximized, the lensed fiber 532 is arranged at a position that results in the value A being less than the value A occurring when the coupling efficiency η is at a maximum.

This adjustment can be made in the same manner for the value B, and therefore the optical system of the laser apparatus 500 may be adjusted such that the value B is less than the value B occurring when the coupling efficiency η is at a maximum. In other words, by positioning the lensed fiber 532 relative to the laser light emission end of the semiconductor laser element 100 such that the coupling efficiency η is maximized, the lensed fiber 532 may be arranged at position that results in the value B being less than the value B occurring when the coupling efficiency η is at a maximum. In the example of FIG. 8, for example, the value B of the laser apparatus 500 can be made less than the value B occurring when the coupling efficiency η is at a maximum by setting the coupling distance L to be 13 μm or more.

In this way, in the laser apparatus 500, the value B determined by optical adjustment within the value A can be adjusted via the optical system. Furthermore, since the $I_{thS}$ and $S.E._M$ values can be determined by adjusting the design values of the semiconductor laser element 100, the linear light output start point can be determined based on the A value.

Figure 9:
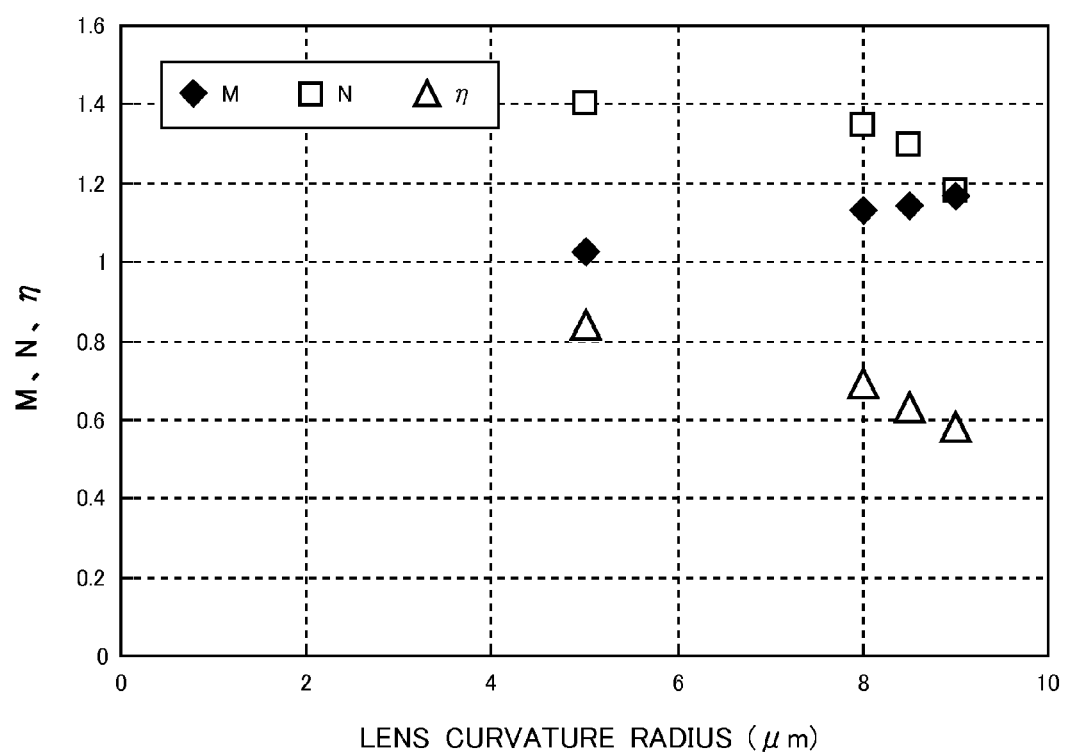
FIG. 9 shows an exemplary relationship between the lens curvature radius and the parameters M, N, and $\eta$ of the laser apparatus according to the first embodiment.

FIG. 9 shows an exemplary relationship between the lens curvature radius and the parameters M, N, and η of the laser apparatus according to the first embodiment. In the present embodiment, it is understood that when the lens curvature radius is increased from approximately 5 μm, the η value decreases and the coupling efficiency reaches a maximum when the lens curvature radius is approximately 5 μm, within the range of experimental results. Furthermore, it is understood that the M and N values change in a monotonic manner with respect to the increase in the lens curvature radius, within the range of the experimental results.

Figure 10:
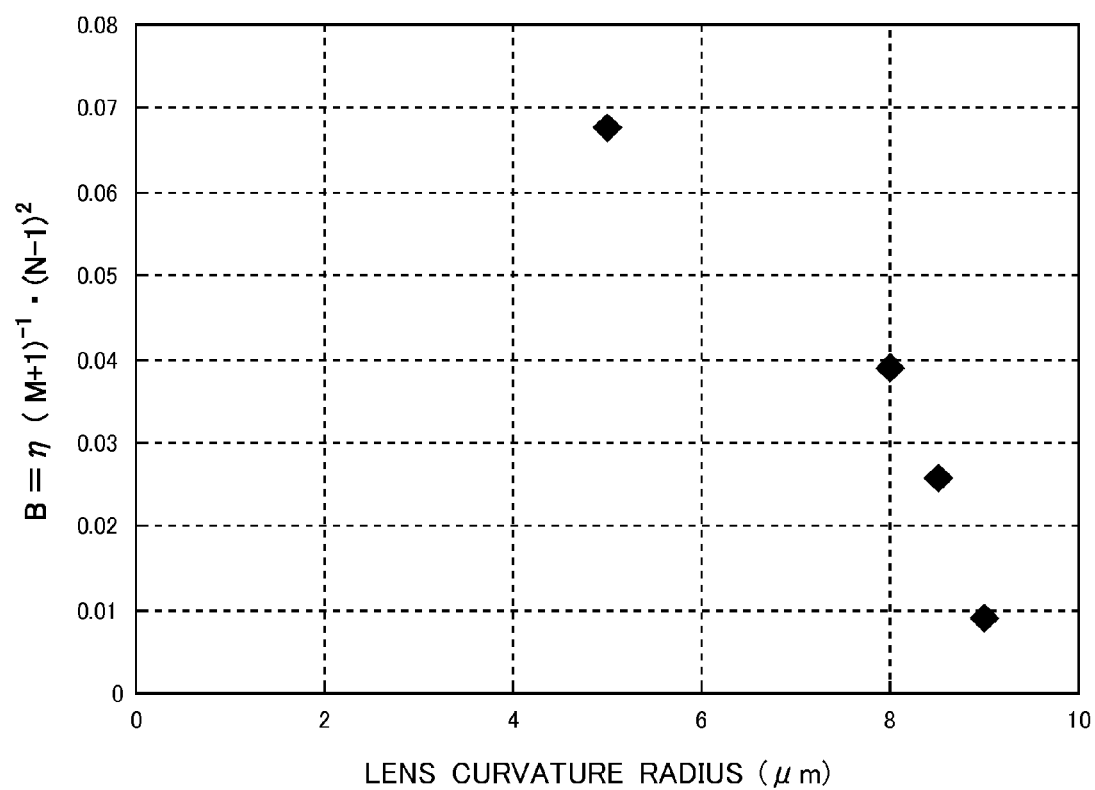
FIG. 10 shows an exemplary relationship between the lens curvature radius and the B value in the laser apparatus according to the first embodiment.

FIG. 10 shows an exemplary relationship between the lens curvature radius and the B value in the laser apparatus according to the first embodiment. It is understood that the B value reflects changes in the M and N values, and changes in a monotonic manner with respect to the increase in the lens curvature radius. Accordingly, the lens curvature radius may be increased to adjust the A or B value. In other words, in the laser apparatus 500, the lens curvature radius of the lensed fiber 532 may be greater than the curvature radius that maximizes the coupling efficiency with the laser light emission end of the semiconductor laser element 100. As a result, in the laser apparatus 500, the B value can be made less than the B value occurring when the coupling efficiency η is at a maximum.

Figure 11:
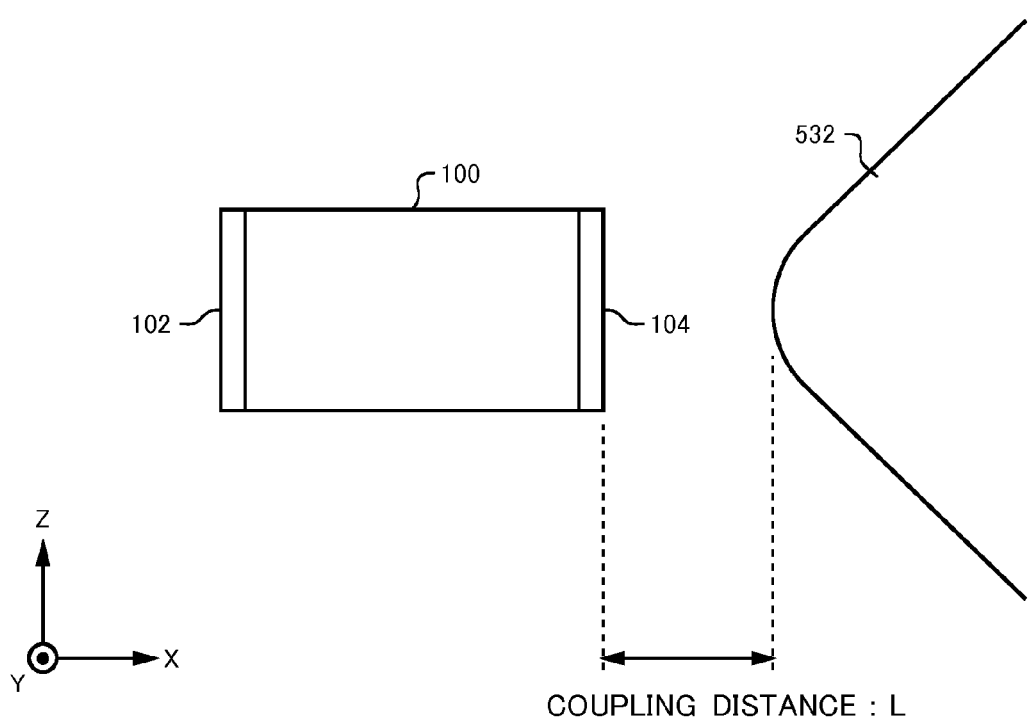
FIG. 11 is a side view of a lensed fiber and a semiconductor laser element according to a second embodiment of the present invention.
Figure 12:
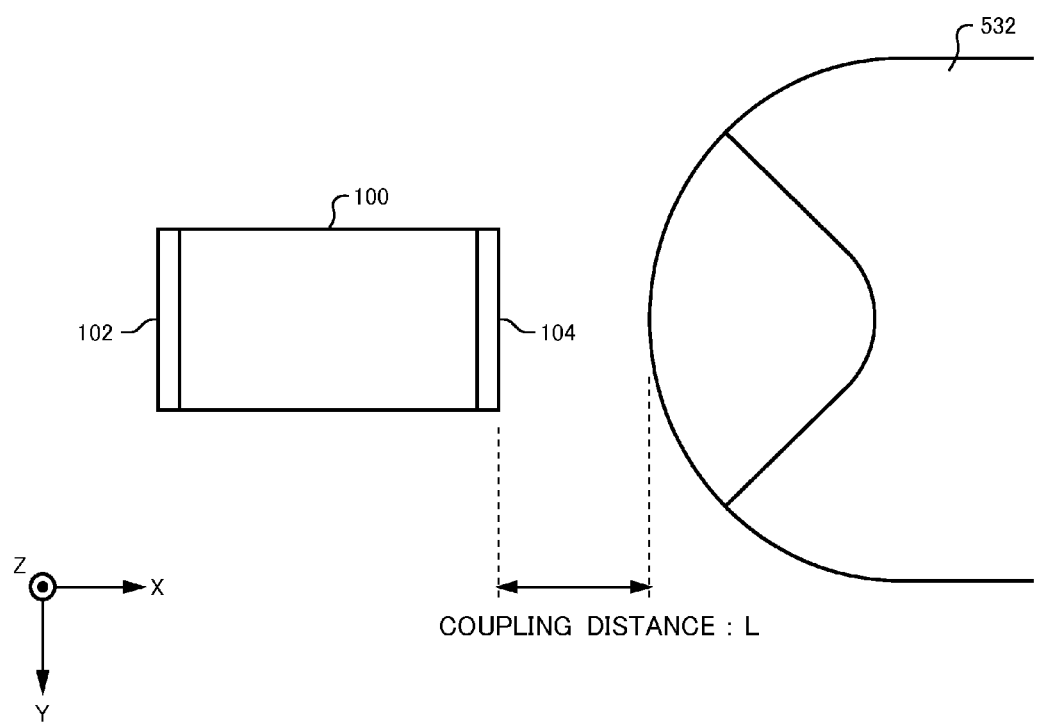
FIG. 12 is a top view of the lensed fiber and the semiconductor laser element according to the second embodiment.

FIG. 11 is a side view of a lensed fiber 532 and a semiconductor laser element according to a second embodiment of the present invention. FIG. 12 is a top view of the lensed fiber 532 and the semiconductor laser element according to the second embodiment.

An anti-reflection (AR) coating process may be applied to the tip of the lensed fiber 532, for example, to decrease the reflection of light at the tip. However, even if this process is applied to the tip of the lensed fiber 532, a small amount of reflected light might still be reflected toward the semiconductor laser element 100. This reflected light is a cause of unstable oscillation in the semiconductor laser element 100, and if this reflected light has a high intensity, the linear light output start point of the laser apparatus 500 is shifted to be a higher output.

The second embodiment of the present invention involves processing the tip of the lensed fiber 532 to decrease the reflected light from the tip of the lensed fiber 532. In the second embodiment, one end of the lensed fiber 532 undergoes processing to be lensed in two or more directions. In the example shown in FIGS. 11 and 12, the lensed fiber 532 is a fiber that has undergone processing to have convex lenses in the Z direction and Y direction, but has not undergone lens processing in the X direction.

By processing the tip of the lensed fiber 532 in this way, the reflected light propagated in the direction of the semiconductor laser element 100 can be reduced. Accordingly, the lensed fiber 532 of the second embodiment can be positioned closer to the semiconductor laser element 100 than the lensed fiber 532 of the first embodiment.

In this way, the linear light output start point of the laser apparatus 500 can be shifted to a lower output, while adjusting the coupling coefficient between the lensed fiber 532 and the semiconductor laser element 100. In other words, compared to the laser apparatus 500 of the first embodiment, the laser apparatus 500 of the second embodiment can realize greater optical output from the same injection current, without changing the linear light output start point.

Furthermore, when the intensity of the reflected light occurring at the tip of the lensed fiber 532 is lower than the intensity that would cause the linear light output start point to become greater than or equal to a predetermined output, the lensed fiber 532 may be arranged at a distance from the semiconductor laser element 100 that is less than the distance L resulting in the maximum coupling efficiency with the semiconductor laser element 100. For example, when adjusting the optical system, the lensed fiber 532 may be arranged at the distance L from the semiconductor laser element 100 that realizes the highest coupling efficiency η with the semiconductor laser element 100. In this way, the linear light output start point can be shifted to a lower output in the laser apparatus 500, while increasing the coupling efficiency η between the semiconductor laser element 100 and the lensed fiber 532.

The curvature radius of the convex lens formed by processing the lensed fiber 532 in the Z direction may be greater than or less than the curvature radius that maximizes the coupling efficiency. According to the results shown in FIGS. 9 and 10, the lens curvature radius may be adjusted to adjust the A value or B value.

The second embodiment describes an example in which one end of the lensed fiber 532 undergoes processing to be lensed in two directions. Instead, the lensed fiber 532 may also be processed to have a convex lens in the YZ direction, to realize lensing in a total of three directions. As another example, the lensed fiber 532 may undergo processing to be lensed in a greater number of directions. As yet another example, the lensed fiber 532 may be processed to have a spherical or semi-spherical end.

Figure 13:
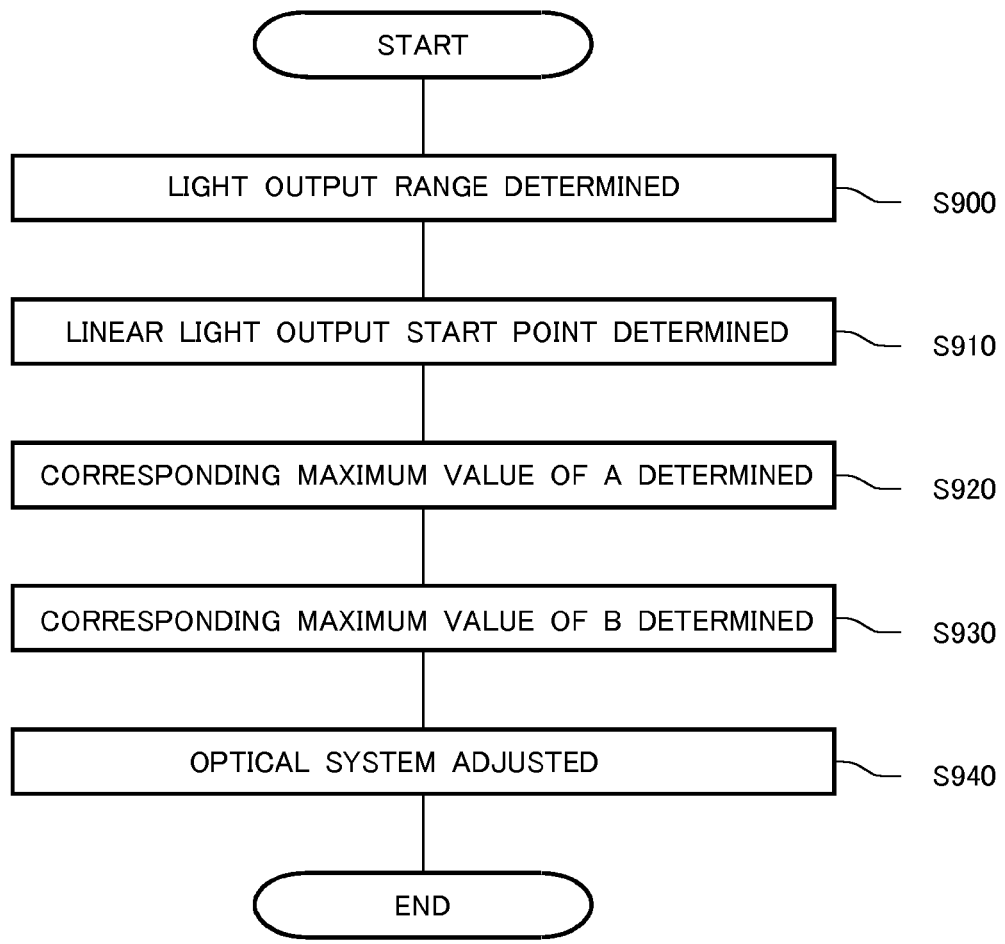
FIG. 13 shows a process flow for adjusting the optical system of the laser apparatus according to the first embodiment.

FIG. 13 shows a process flow for adjusting the optical system of the laser apparatus 500 according to the first embodiment. First, the light output range of the laser apparatus 500 is determined (S900). Specifically, the minimum driving light output of the laser apparatus 500 is determined. For example, the light output range of the laser apparatus 500 may be determined to be in a range no less than 10 mW.

Next, the linear light output start point, which is the minimum linear light output at which the light output of the laser apparatus 500 is in the linear light output region with respect to the injection current injected to the semiconductor laser element 100, is determined according to the determined minimum driving light output (S910). The linear light output start point is determined within a range of values no greater than the minimum driving light output. For example, the linear light output start point may be determined to be 8 mW.

Next, the maximum value of A corresponding to the determined linear light output start point is determined (S920). The maximum value of A can be acquired from the graph of FIG. 6. For example, the maximum value of A may be determined to be 16 mW·mA, such that the linear light output start point is no greater than 8 mW.

Next, the maximum value of B is acquired, based on the determined maximum value of A (S930). Specifically, since the $I_{thS}$ and $S.E._M$ values can be determined according to the semiconductor laser element 100 being used, the maximum value of B corresponding to the determined maximum value of A can be acquired by using Expressions 1 and 2.

For each chip of the manufactured semiconductor laser element 100, the $I_{thS}$ and $S.E._M$ values are measured in advance and semiconductor laser elements 100 having corresponding $I_{thS}$ and $S.E._M$ values may be selected based on the A value and/or B value. As another example, a correlation between the $I_{thS}$ and $S.E._M$ values and manufacturing parameters of semiconductor laser elements 100 that have already been manufactured may be recorded, and semiconductor laser elements 100 having the corresponding $I_{thS}$ and $S.E._M$ values may be manufactured.

Next, the optical system is adjusted based on the maximum value of B (S940). Specifically, the optical system is adjusted such that the maximum value of B is not exceeded. For example, the coupling distance L between the semiconductor laser element 100 and the lensed fiber 532 or the lens curvature radius of the lensed fiber 532 may be adjusted such that the B value is less than the B value occurring when the coupling efficiency η with the emission surface of the semiconductor laser element 100 is at a maximum.

In this way, specific adjustment target values of the optical system can be obtained based on a predetermined light output range for the laser apparatus 500. By adjusting the optical system within the laser apparatus 500 such that the maximum values for A and B are not exceeded, the laser apparatus 500 can perform longitudinal multimode oscillation within a predetermined light output range to achieve stable light output.

Specifically, the adjustment method of the present embodiment is a method for adjusting the optical system of a laser apparatus that includes a semiconductor laser element, a wavelength selecting section that performs laser oscillation by forming a resonator between itself and a reflective surface of the semiconductor laser element, and an optical system that guides the laser light output by the semiconductor laser element to the wavelength selecting section. This method includes determining a minimum driving light output of the laser apparatus, determining a minimum linear light output, which is a minimum light output of the laser apparatus within a linear light output region in which the light output is linear with respect to an injection current injected into the semiconductor laser element, and determining a maximum value for a value B correlated with optical coupling between the optical system and the semiconductor laser element, where the value B is included within a value A defined according to Expressions 1 and 2, which are correlated with the minimum linear light output. When determining the maximum value for B, the value of B is set to be less than the value of B occurring when the coupling efficiency η with the emission surface of the semiconductor laser element is at a maximum.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A laser apparatus comprising:
   a semiconductor laser element;
   a wavelength selecting element that performs laser oscillation by forming a resonator between itself and a reflective surface of the semiconductor laser element to output oscillated laser light; and
   an optical system that is optically coupled to an emission surface of the semiconductor laser element with a coupling efficiency η and inputs to the wavelength selecting element light output from the emission surface, the optical system being arranged such that a coupling distance L between the semiconductor laser element and the optical system has a value that is greater than a first value of the coupling distance L that results in a maximum coupling efficiency η and greater than a second value of the coupling distance L that results in a value of A equal to the value of A when the coupling distance L has the first value, thereby avoiding a peak in the value of A between the first and second values of the coupling distance L, wherein $$A=\{I_{thS}^2 \cdot S.E._M \cdot \eta \cdot (M+1)^{-1} \cdot (N-1)^2\}/2,$$

$$M=S.E._M/S.E._S,$$

$$N=I_{thM}/I_{thS},$$

$I_{thS}$ represents a single mode oscillation threshold value,
$I_{thM}$ represents a multimode oscillation threshold value,
$S.E._S$ represents single mode efficiency, and
$S.E._M$ represents multimode efficiency.

2. The laser apparatus according to claim 1, wherein longitudinal multimode oscillation is performed within the linear light output region.

3. The laser apparatus according to claim 1, wherein the optical system is a lensed fiber that undergoes processing to be lensed on one end thereof and guides the laser light output from the semiconductor laser element to the wavelength selecting element.

4. The laser apparatus according to claim 3, wherein the lensed fiber is arranged at a position farther from a laser light emission end of the semiconductor laser element than a position that maximizes coupling efficiency with the laser light emission end.

5. The laser apparatus according to claim 3, wherein a lens curvature radius of the lensed fiber is greater than a curvature radius that maximizes coupling efficiency with a laser light emission end of the semiconductor laser element.

6. The laser apparatus according to claim 3, wherein one end of the lensed fiber undergoes processing to be lensed in two or more directions.

7. The laser apparatus according to claim 3, wherein the lensed fiber causes a value B, which is correlated with a minimum light output within a linear light output region in which light output is linear, to be less than the value B occurring when the coupling efficiency η is at a maximum, $$B=\eta \cdot (M+1)^{-1} \cdot (N-1)^2\},$$

$$M=S.E._M/S.E._S,$$

$$N=I_{thM}/I_{thS},$$

$I_{thS}$ represents a single mode oscillation threshold value,
$I_{thM}$ represents a multimode oscillation threshold value,
$S.E._S$ represents single mode efficiency, and
$S.E._M$ represents multimode efficiency.

8. The laser apparatus according to claim 1, wherein the optical system causes the value A to be less than 16 mW·mA.

9. The laser apparatus according to claim 1, wherein the wavelength selecting element is a fiber Bragg grating.

10. The laser apparatus according to claim 1, wherein the semiconductor laser element outputs a 980 nm band or a 1480 nm band of laser light.

11. A laser apparatus comprising:
a semiconductor laser element;
a wavelength selecting element that performs laser oscillation by forming a resonator between itself and a reflective surface of the semiconductor laser element to output oscillated laser light; and
a lensed fiber that is optically coupled to an emission surface of the semiconductor laser element with a coupling efficiency η and guides laser light output from the semiconductor laser element to the wavelength selecting element, the lensed fiber being arranged such that a coupling distance L between the semiconductor laser element and the lensed fiber has a value that is greater than a first value of the coupling distance L that results in a maximum coupling efficiency η and greater than a second value of the coupling distance L that results in a value of B equal to the value of B when the coupling distance L has the first value, thereby avoiding a peak in the value of B between the first and second values of the coupling distance L, wherein $$B=\eta \cdot (M+1)^{-1} \cdot (N-1)^2\},$$

$$M=S.E._M/S.E._S,$$

$$N=I_{thM}/I_{thS},$$

$I_{thS}$ represents a single mode oscillation threshold value,
$I_{thM}$ represents a multimode oscillation threshold value,
$S.E._S$ represents single mode efficiency, and
$S.E._M$ represents multimode efficiency.

12. The laser apparatus according to claim 11, wherein longitudinal multimode oscillation is performed within the linear light output region.

13. The laser apparatus according to claim 11, wherein a lens curvature radius of the lensed fiber is greater than a curvature radius that maximizes coupling efficiency with a laser light emission end of the semiconductor laser element.

14. The laser apparatus according to claim 11, wherein one end of the lensed fiber undergoes processing to be lensed in two or more directions.

15. The laser apparatus according to claim 11, wherein the wavelength selecting element is a fiber Bragg grating.

16. The laser apparatus according to claim 11, wherein the semiconductor laser element outputs a 980 nm band or a 1480 nm band of laser light.

* * * * *